United States Patent [19]
Murofushi et al.

[11] Patent Number: 6,008,634
[45] Date of Patent: Dec. 28, 1999

[54] ELECTRICAL JUNCTION BOX

[75] Inventors: Haruyoshi Murofushi; Noboru Yamaguchi, both of Shizuoka, Japan

[73] Assignee: Yazaki Corporation, Tokyo, Japan

[21] Appl. No.: 08/942,693

[22] Filed: Sep. 29, 1997

[30] Foreign Application Priority Data

Sep. 30, 1996 [JP] Japan .................................. 8-259345

[51] Int. Cl.⁶ .............................................. G01R 33/00
[52] U.S. Cl. .................................. 324/117 H; 324/117 R
[58] Field of Search ........................... 324/117 H, 117 R, 324/126, 127

[56] References Cited

U.S. PATENT DOCUMENTS

| | | | |
|---|---|---|---|
| 5,041,780 | 8/1991 | Rippel | 324/117 R |
| 5,343,143 | 8/1994 | Voisine et al. | 324/117 R |
| 5,831,425 | 11/1998 | Ochiai | 324/117 R |

FOREIGN PATENT DOCUMENTS 64-42465  3/1989  Japan .

*Primary Examiner*—Josie Ballato
*Assistant Examiner*—T. R. Sundaram
*Attorney, Agent, or Firm*—Armstrong, Westerman, Hattori, McLeland and Naughton

[57] ABSTRACT

An electrical junction box includes an electrical circuit, a current sensor having a ferrite bead ring for generating a magnetic field according to a current flow in the electrical circuit and also having a Hall element for outputting a signal based on the magnetic field of the ferrite bead ring, and a connector section for mounting both the ferrite bead ring and the Hall element. The electrical circuit has a terminal inserted through the ferrite bead ring to extend toward an opposing connector associated with the connector section. Furthermore, the Hall element has an output terminal extending toward the opposing connector.

6 Claims, 6 Drawing Sheets

16,008,634

ELECTRICAL JUNCTION BOX

BACKGROUND OF THE INVENTION

1. Field of the Invention

The present invention relates to an electrical junction box such as a fuse box, more particularly to an electrical junction box having a current sensor that includes both a ferrite bead and a Hall element.

2. Prior Art

A known electrical junction box having a current sensor is disclosed, for example, in Japanese Design Model Application Laid-open No. 64-42465.

FIG. 6 is a perspective view showing the known electrical junction box illustrated in the '465 Application. Furthermore, FIGS. 7A to 7C show a current detecting circuit provided in the electrical junction box, FIG. 7A being an exploded perspective view thereof, FIG. 7B a perspective view in the completely assembled condition, and FIG. 7C a sectional view of FIG. 7B.

Referring to FIG. 6, the electrical junction box (a main fuse box) 100 has a box 101 and a cover 102 both formed in a U-shape, in which there are disposed fuses 103, 104. For major electrical wiring in the box 101, there are disposed busbar strips 105 on a bottom surface of the box 101.

Further, adjacent to the main fuse 103 in the box 101 is arranged a current detecting circuit 106 that has been received in an exclusive case 110 (see FIG. 7A).

Next, referring to FIGS. 7A to 7C, the current detecting circuit 106 will be discussed.

In these figures, denoted 111 is a ferrite bead that is inserted in the case 110 to be located around a hollow pillar 110a. The ferrite bead 111 is formed with a cutout 111a into which a Hall element 112 is inserted upwardly in the case 110. The ferrite bead 111 and the Hall element 112 constitutes a current sensor that can detect a current flown in busbars 113, 114 (current detecting terminals) inserted into the hollow pillar 110a.

The busbars 113,114 connect respectively to power supplying cables 115,116. More specifically, the busbar 113 connects to a battery (not shown) by way of the cable 115 illustrated in FIG. 6, and the busbar 114 connects to various kinds of loads (not shown) by way of the cable 116 illustrated in FIG. 6 for detecting currents thereof.

Denoted 117 is an amplifier for amplifying a detected signal outputted from the Hall element 112. A connector 118 connects terminals including an output terminal of the Hall element 112 to a control unit (not shown). Further, denoted 119 is a fixing member for securing the ferrite bead 111 in the hollow pillar 110a.

However, in the aforementioned known electrical junction box 100, the busbars 113, 114 are connected respectively to the power supplying cables 115, 116, while the output terminal of the Hall element 112 must be connected to the control unit by way of the connector 118. Therefore, a more efficient connection device for the current detecting circuit 106 has been desired to reduce hand work.

In addition, it requires a lot of hand works to assemble the current detecting circuit 106 itself, since it includes relatively many element parts.

Moreover, the exclusive case 110 occupies a larger space in the electrical junction box 100, causing the electrical junction box 100 to enlarge in size.

SUMMARY OF THE INVENTION

In view of the above-mentioned problems, an object of the present invention is to provide an electrical junction box that has a current sensor mounted in a connector section formed in the junction box, allowing connection works of a terminal for current detection and of an output terminal for a Hall element to be done together at once. This will also enable a simplified mounting work of the current sensor to eliminate an exclusive case for a current detecting circuit, causing a reduction in the number of element parts and a great reduction in arrangement space.

For achieving the object, a first configuration of an electrical junction box includes:

a current detecting terminal for an electrical circuit, a current sensor having a ferrite bead ring for generating a magnetic field according to a current flow in the electrical circuit, and also having a Hall element for outputting a signal based on the magnetic field of the ferrite bead ring, and a connector section for mounting both the ferrite bead ring and the Hall element, wherein the current detecting terminal is inserted through the ferrite bead ring to extend toward an opposing connector associated with the connector section, and the Hall element has an output terminal extending toward the opposing connector.

In the configuration, the connector section provided in the electrical junction box may couple with an opposing connector, allowing connection works of a terminal for current detection and of an output terminal for a Hall element to be done together at once.

This will also enable a simplified mounting work of the current sensor to eliminate an exclusive case for a current detecting circuit, causing a reduction in the number of element parts and a great reduction in arrangement space. In addition, the elimination of the exclusive case allows a minimized electrical junction box.

A second configuration of the electrical junction box further includes that said connector section is configured as a recess formed unitedly in a housing of the electrical junction, the ferrite bead ring and the Hall element being mounted on a bottom portion of the recess.

In the second configuration, the connector section may be defined unitedly in the electrical junction box, allowing a further reduction in the number of element parts and a more simplified assembling. Moreover, both the terminal for current detection and the output terminal for the Hall element can be received within the connector section not to extend externally.

A third configuration of the electrical junction box includes that the terminal inserted through the ferrite bead ring is of a busbar type. Advantageously, this enables a simplified thin terminal for detecting electrical current thereof.

A fourth configuration of the electrical junction box includes that the terminal inserted through the ferrite bead ring and the output terminal of the Hall element are shielded from each other by electrostatic shielding.

In the configuration, electrostatic induction between the current detecting terminal used for a large current and the Hall element output terminal outputting a feeble electromotive force can be smaller, ensuring a correct detection operation of the current sensor.

DETAILED DESCRIPTION OF PREFERRED EMBODIMENTS

Referring to the accompanied drawings, embodiments of electrical junction boxes embodying the present invention will be discussed hereinafter. To begin with a first embodiment thereof, FIG. 1 is a perspective view showing a connector sections of an electrical junction box, and FIG. 2 is a side sectional view of the connector section.

Figure 3:
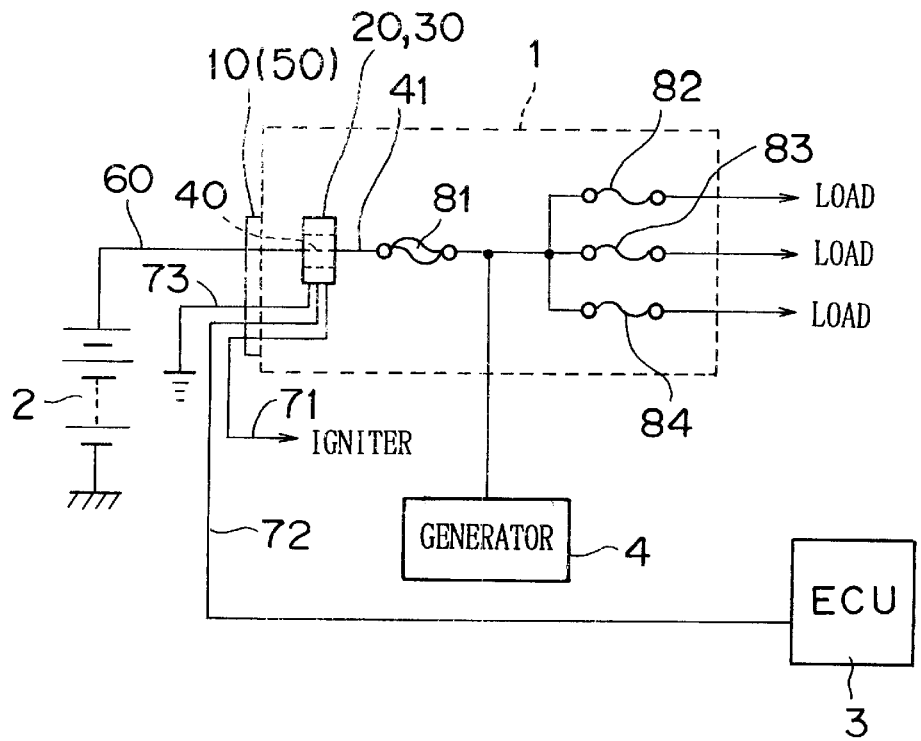
FIG. 3 is a circuit diagram of a power circuit in an automotive vehicle, in which the electrical junction box is utilized.

The embodiment of the electrical junction box can be used in a power circuit of an automotive vehicle. FIG. 3 is an example of such power circuit diagrams including the electrical junction box for an automotive vehicle.

Since the electrical junction box according to the present invention is primarily characterized in that the electrical junction box has the connector section that is mounted with a current sensor consisting of both a ferrite bead ring and a Hall element, the other details of the electrical junction box will not be discussed hereupon.

Figure 1:
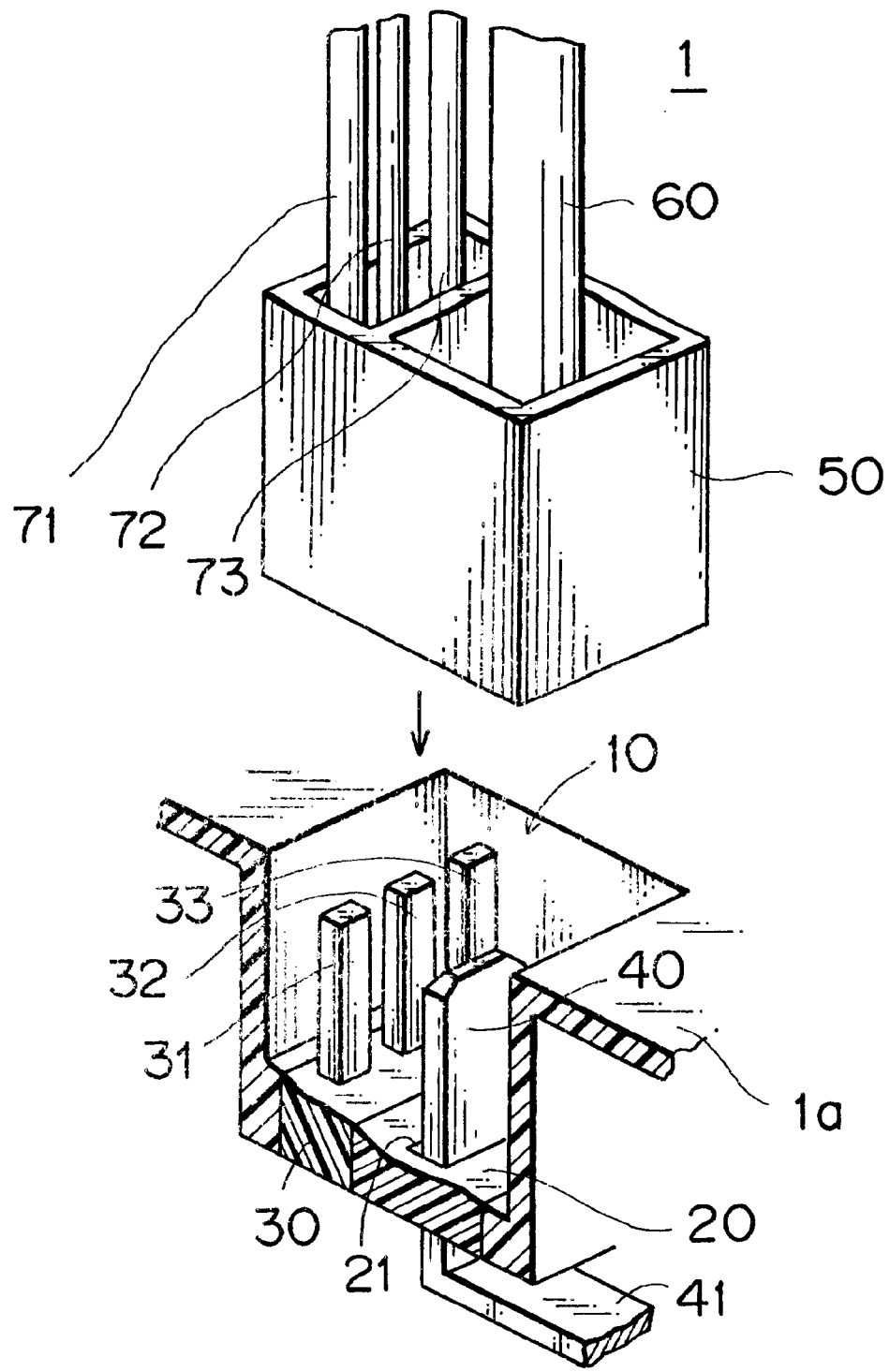
FIG. 1 is a perspective view showing a connector section of an electrical junction box and an associated opposing connector in a first embodiment of the present invention.
Figure 2:
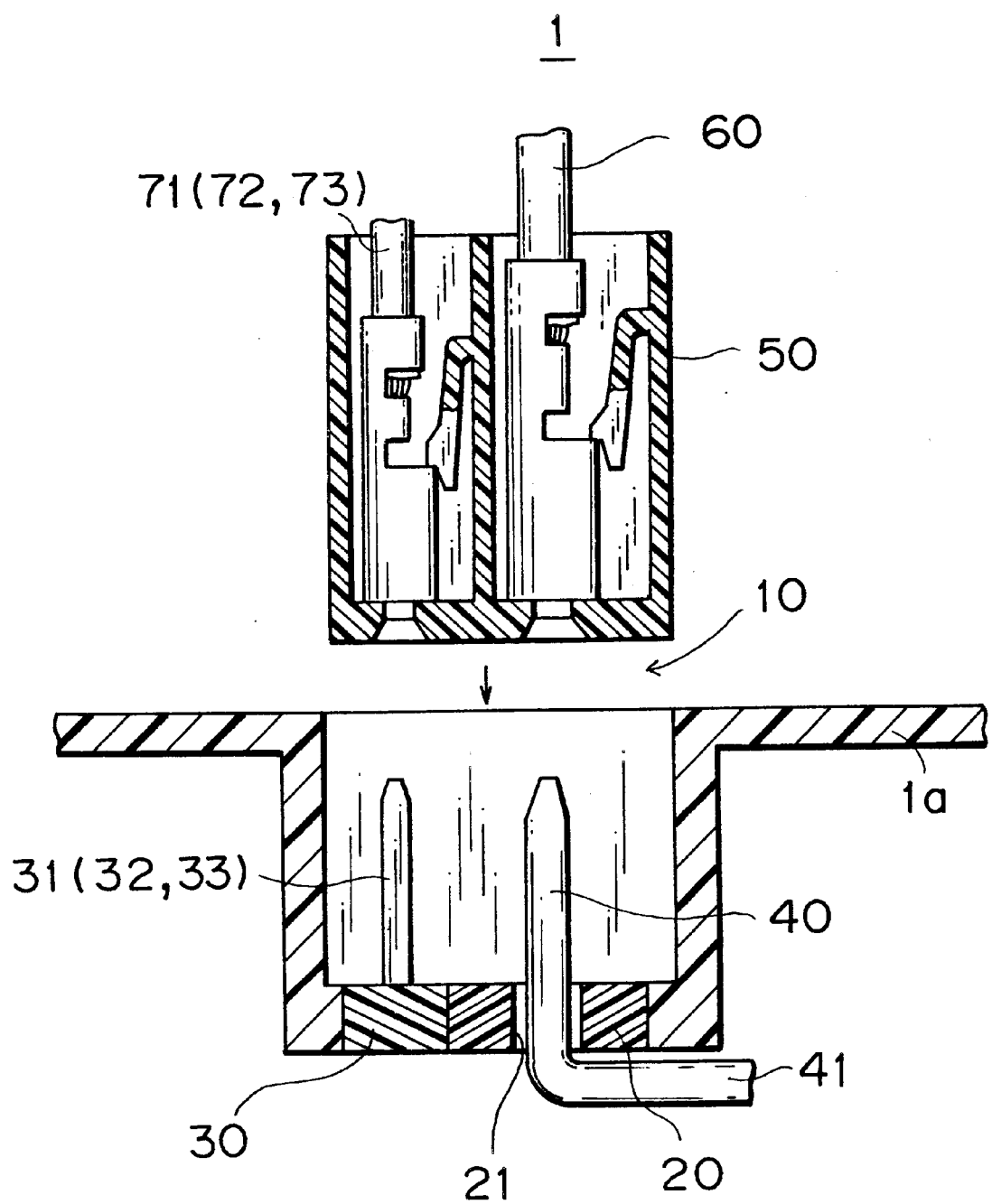
FIG. 2 is a side sectional view of the connector section.

In FIGS. 1 and 2, denoted 1a is a cover constituting a housing for the electrical junction box 1 (see FIG. 3), which is made of an insulating material such as a synthetic resin. The cover 1a is unitedly formed with a recess configuring a connector section 10. On the bottom of the connector section 10 are bonded a ferrite bead ring 20 and a Hall element 30 to be secured thereto.

The ferrite bead ring 20 is a square ring with a center through-hole 21. In the through-hole 21 is inserted a current detecting terminal 40 that is a strip of an angled busbar 41. The current detecting terminal 40 extends in the engagement direction of an associated opposing connector 50 within the connector section 10.

The Hall element 30, as shown in FIG. 1, is disposed adjacent to the ferrite bead ring 20, and has a couple of output terminals 31, 32 and a grounding terminal 33 that are extending within the connector section 10 in the mating direction of the opposing connector 50. The Hall element 30 generates an electromotive force proportional to a magnetic field caused by the ferrite bead ring 20.

Into the opposing connector 50 mated with the connector section 10 are inserted a terminal equipped electric cable 60 connected to the current detecting terminal 40 in the connector section 10, and also terminal equipped electric cables 71, 72, and 73 respectively connected to the output terminals 31, 32 and the grounding terminal 33 in the connector section 10.

Referring to FIG. 3, the electrical junction box 1 disposed in a power circuit of an automotive vehicle will be discussed particularly in its electrical connection arrangement.

In FIG. 3, the current detecting terminal 40 in the connector section 10 is connected to fuses 81 to 84 by way of the busbar 41 within the electrical junction box 1. The fuses 82 to 84 are respectively connected to various kinds of loads (not illustrated) disposed in the automotive vehicle for detecting each circuit current thereof.

Furthermore, the terminal equipped electric cable 60 of the opposing connector 50 connects to a battery 2 (12 V). The terminal connected electric cable 71 of the connector 50 connects to an input terminal of an igniter (not shown). The terminal equipped electric cable 72 connects to an input terminal of a control unit 3. In addition, the terminal connected electric cable 73 is grounded.

Moreover, between the fuse 81 and the fuses 82, 83, 84, an alternating-current generator 4 that supplies power to the battery 2 sequentially by way of the fuse 81, the busbar 41, the current detecting terminal 40, and the terminal equipped electric cable 60.

In the above-mentioned electrical junction box 1, when the connector section 10 has completely received the opposing connector 50, the current detecting terminal 40 and the terminal equipped electric cable 60 are connected together, so that the battery 2 connects to each load sequentially by way of the fuse 81, the alternating-current generator 4, and the fuses 82, 83, and 84.

At the same time, the output terminal 31 (see FIG. 1) of the Hall element 30 connects to the terminal equipped electric cable 72, so that the output terminal 31 makes electrical connection with the control unit 3. Furthermore, the output terminal 32 (see FIG. 1) connects to the terminal equipped electric cable 71, so that the output terminal 32 makes electrical connection with the igniter. In addition the grounding terminal 33 connects to the terminal equipped electric cable 73 so that the terminal 33 is earthed.

Next, the electrical junction box 1 will be discussed in its electrical operation.

When electrical power is supplied from the battery 2, a current that flows in the current detecting terminal 40 of the connector 10 causes the ferrite bead ring 20 to generate a magnetic field. Thereby, the Hall element 30 generates an electromotive force in accordance with the magnetic field, so that the output terminals 31, 32 output a detection signal respectively.

The detection signal in the output terminal 31 (see FIG. 1) is input in the control unit 3. Based on the detection signal, the control unit 3 determines whether each load has normally received the current from the battery 2. Meanwhile, the detection signal in the output terminal 32 is input in the igniter, and based on the signal, a control section (not shown) of the igniter determines the present state of the ignition.

On the other hand, when electrical power is not supplied from the battery 2 to each load, no current flows in the current detecting terminal 40 so that the ferrite bead ring 20 does not generate a magnetic field. Thus, the Hall element 30 outputs no detection signal, which causes the control unit 3 and the control section of the igniter to determine on an abnormal condition.

Meanwhile, when the alternating-current generator 4 applies power to the battery 2, a current flows in the current detecting terminal 40 in the same way as the above, and based on the detection signal from the Hall element 30, the control unit 3 determines whether the current supply is normal.

Figure 4:
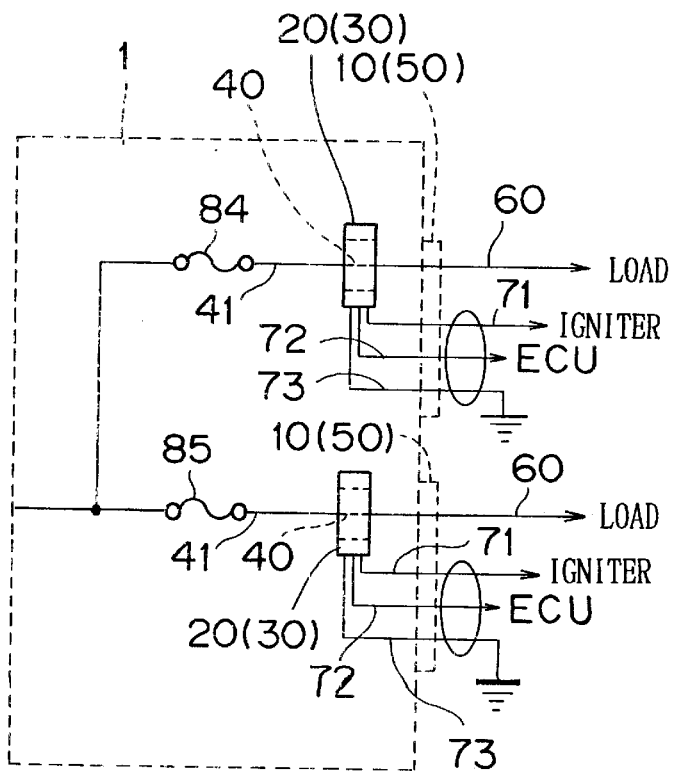
FIG. 4 is a modified circuit diagram of the electrical junction box in the first embodiment.

FIG. 4 is a modified circuit diagram related to the first embodiment of the electrical junction box, in which the connector section 10 and the opposing connector 50 are disposed between two loads and fuses 84, 85 connected respectively to each load.

In this configuration, each current between the battery 2 and each load can be detected respectively by the control unit 3 or the control section.

In the configuration of the electrical junction box 1 of the above-mentioned embodiments, the connector section 10 formed unitedly in the cover 1a of the electrical junction box 1 and mated with the opposing connector 50 can accomplish the connections at a time both of the current detecting terminal 40 and the output terminals 31, 32, and 33 of the Hall element 30. Thus, the connections of these terminals 40, 31, 32, and 33 are completed easily and surely.

In addition, since the current sensor consisting of both the ferrite bead ring 20 and the Hall element 30 is mounted in the connector section 10, no exclusive case for the current sensor is required, decreasing the number of element parts and enabling a great reduction in mounting space. This also can make the electrical junction box 1 smaller in general size.

Furthermore, the current detecting terminal 40 and each output terminal 31, 32, 33 of the Hall element 30 can be received within the recess of the connector section 10.

In addition, since the current detecting terminal 40 inserted into the ferrite bead ring 20 is a busbar type one, the terminal 40 is preferably thin in thickness and is easy in its attachment.

Next, referring to FIG. 5, a second embodiment of an electrical junction box of present invention will be discussed hereinafter.

Figure 5:
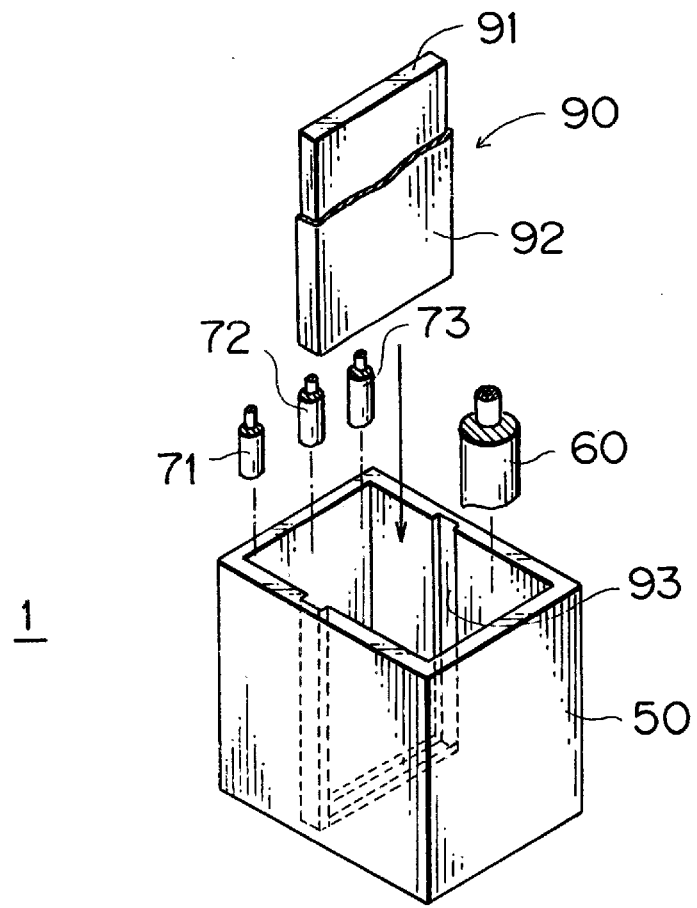
FIG. 5 is a perspective view showing a connector section of an electrical junction box and an associated opposing connector in a second embodiment of the present invention.
Figure 5:
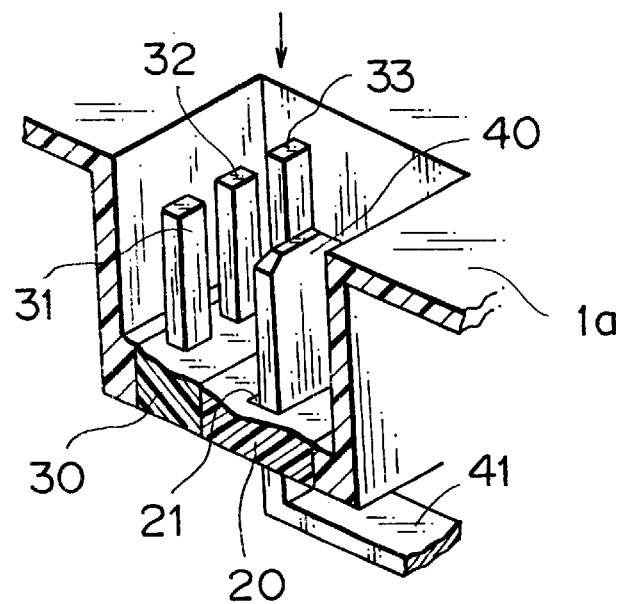
Figure 6:
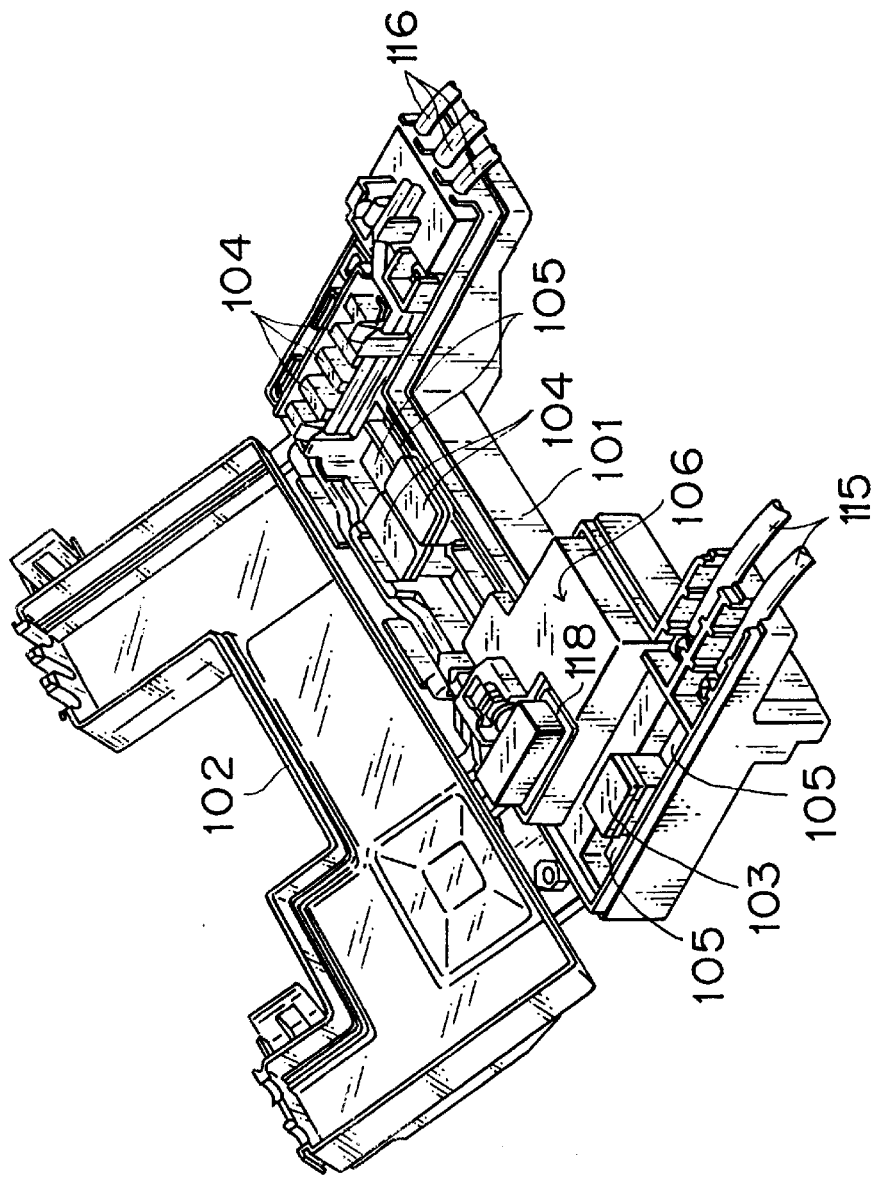
FIG. 6 is a perspective view showing a known electrical junction box disclosed in Japanese Utility Model Application Laid-open No. 64-42465.
Figure 7A:
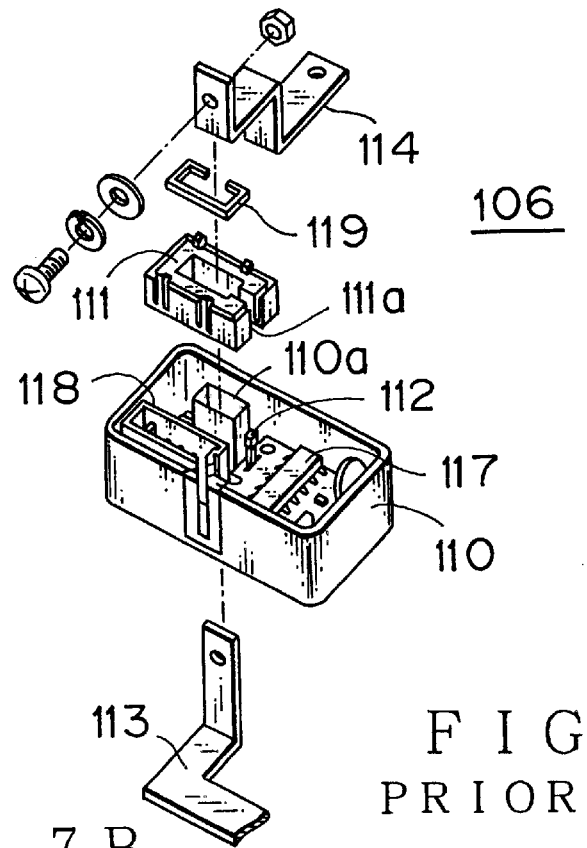
FIGS. 7A to 7C show a current detecting circuit assembly in the known electrical junction box, FIG. 7A being an exploded perspective view, FIG. 7B a perspective view in the completely assembled state, and FIG. 7C a sectional view of FIG. 7B.
Figure 7B:
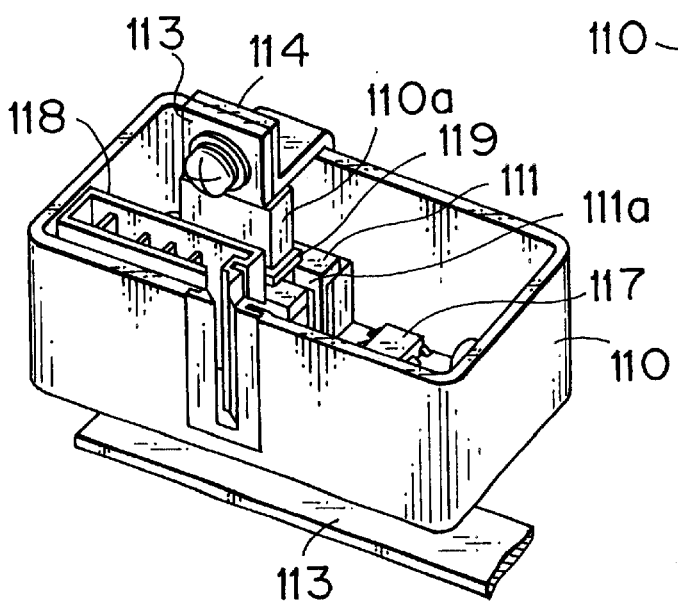
Figure 7C:
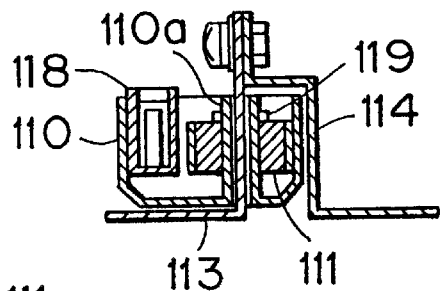

FIG. 5 is a perspective view showing a connector section of the second embodiment and an associated opposing connector.

The opposing connector 50 of an electrical junction box 1 has a terminal partition of a shielding plate 90 that can shield electrostatically the current detecting terminal 20 and the output terminals 31, 32, 33 of the Hall element 30 from each other.

The shielding plate 90 consists of an electrically conductive plate 91, such as an aluminum plate, that is covered by an insulating material 92. The plate 90 is secured in a fitting groove 93 formed in a connect or housing of the opposing connector 50 with an adhesive.

This configuration reduces electrostatic induction in the output terminals 31, 32 of the Hall element 30 that generates a feeble electromotive force, which is caused by a large current that flows in the current detecting terminal 40, allowing correct detection in the current sensor.

The electrical junction box according to the present invention is not limited to the aforementioned first and second embodiments. For example, the electrical junction box 1 in the first embodiment, which is disposed in a power circuit of an automotive vehicle, can also be applied to various types of electrical circuits.

In addition, although the Hall element 30 is provided with the two output terminals 31, 32, one or more than two output terminals may be mounted thereon.

Meanwhile, the shielding plate 90 in the second embodiment consists of the conductive plate 91 covered by the insulating material 92, which may be altered to an electrical conductive plate each surface of which is insulated by such a process as carbonization, oxidation, or nitriding (for example, an ALMITE plate).

What is claimed is:

1. An electrical junction box comprising:

a current detecting terminal for an electrical circuit;

a current sensor having a ferrite bead ring for generating a magnetic field according to a current flow in said electrical circuit, and also having a Hall element for outputting a signal based on the magnetic field of said ferrite bead ring, and a connector section for mounting both said ferrite bead ring and said Hall element, said connector section being configured as a recess formed unitedly in a housing of said electrical junction; and wherein said current detecting terminal is inserted through said ferrite bead ring to extend into the recess toward an opposing connector associated with said connector section, and said Hall element has an output terminal extending toward the opposing connector.

2. An electrical junction box as claimed in claim 1, wherein said connector section is configured as a recess formed unitedly in a housing of said electrical junction, said ferrite bead ring and said Hall element being mounted on a bottom portion of the recess.

3. An electrical junction box as claimed in claim 1, wherein the terminal inserted through said ferrite bead ring is of a busbar type.

4. An electrical junction box as claimed in claim 1, wherein said current detecting terminal of said ferrite bead ring and the output terminal of said Hall element are shielded from each other by electrostatic shielding.

5. An electrical junction box as claimed in claim 1, wherein a terminal partition of a shielding plate is provided in the opposing connector that can shield electrostatically said current detecting terminal and said output terminal of said Hall element from each other when the opposing connector is received in said connector section.

6. An electrical junction box as claimed in claim 5, wherein said shielding plate is constituted of an electrically conductive plate that is covered by an insulating material.

* * * * *